US011243561B2

(12) United States Patent
Mautner et al.

(10) Patent No.: US 11,243,561 B2
(45) Date of Patent: Feb. 8, 2022

(54) BYZANTINE ASYNCHRONOUS TIMING EXCHANGE FOR MULTI-DEVICE CLOCK SYNCHRONIZATION

(71) Applicant: THE CHARLES STARK DRAPER LABORATORY, INC., Cambridge, MA (US)

(72) Inventors: Eric Karl Mautner, Hudson, MA (US); Brianna Klingensmith, Arlington, MA (US)

(73) Assignee: THE CHARLES STARK DRAPER LABORATORY, INC., Cambridge, MA (US)

(*) Notice: Subject to any disclaimer, the term of this patent is extended or adjusted under 35 U.S.C. 154(b) by 210 days.

(21) Appl. No.: 16/522,163

(22) Filed: Jul. 25, 2019

(65) Prior Publication Data

US 2020/0097040 A1    Mar. 26, 2020

Related U.S. Application Data

(60) Provisional application No. 62/736,579, filed on Sep. 26, 2018, provisional application No. 62/736,592, filed on Sep. 26, 2018, provisional application No. 62/736,585, filed on Sep. 26, 2018, provisional application No. 62/736,589, filed on Sep. 26, 2018.

(51) Int. Cl.
| | | |
|---|---|---|
| *G06F 1/12* | (2006.01) | |
| *G06F 1/14* | (2006.01) | |
| *H04L 7/00* | (2006.01) | |
| *G06F 13/12* | (2006.01) | |
| *H03L 7/081* | (2006.01) | |
| *H03L 7/099* | (2006.01) | |

(52) U.S. Cl.
CPC ............... *G06F 1/14* (2013.01); *G06F 1/12* (2013.01); *G06F 13/122* (2013.01); *H03L 7/0814* (2013.01); *H03L 7/0991* (2013.01); *H04L 7/0025* (2013.01); *H04L 7/0037* (2013.01)

(58) Field of Classification Search
CPC . G06F 1/14; G06F 13/122; G06F 1/12; H03L 7/0814; H03L 7/0991; H04L 7/0025; H04L 7/0037; H04J 3/0676
USPC ................................................... 713/400
See application file for complete search history.

(56) References Cited

U.S. PATENT DOCUMENTS

| | | | | |
|---|---|---|---|---|
| 5,557,623 | A * | 9/1996 | Discoll | G06F 1/14 714/797 |
| 8,675,665 | B2 * | 3/2014 | Umayabashi | H04J 3/0632 370/395.62 |
| 10,205,586 | B2 * | 2/2019 | Paul | H04L 7/033 |
| 10,423,468 | B2 * | 9/2019 | Doyle | G06F 9/542 |
| 2009/0040920 | A1 * | 2/2009 | Malekpour | G06F 1/12 370/216 |
| 2009/0102534 | A1 * | 4/2009 | Schmid | G06F 1/04 327/292 |

(Continued)

OTHER PUBLICATIONS

Watt, Steve T. et al., "Understanding and Applying Precision Time Protocol", Saudi Arabia Smart Grid 2015, Jeddah, Saudi Arabia, Dec. 7-9, 2015, pp. 1-8.

*Primary Examiner* — Volvick Derose
(74) *Attorney, Agent, or Firm* — Lando & Anastasi, LLP

(57) ABSTRACT

The present disclosure relates to systems and methods to maintain clock synchronization of multiple computers, or computer systems, through the exchange of communication messages that include clock and/or timing information.

17 Claims, 7 Drawing Sheets

(56) References Cited

U.S. PATENT DOCUMENTS

| | | | |
|---|---|---|---|
| 2009/0316847 A1 | 12/2009 | Thomsen | |
| 2010/0019811 A1* | 1/2010 | Malekpour | G06F 1/14 327/144 |
| 2012/0030495 A1* | 2/2012 | Chandhoke | G06F 1/10 713/400 |
| 2012/0221889 A1 | 8/2012 | Beilin et al. | |
| 2015/0071309 A1* | 3/2015 | Aweya | H04J 3/0682 370/503 |
| 2015/0092797 A1* | 4/2015 | Aweya | H04J 3/0667 370/516 |
| 2016/0095078 A1* | 3/2016 | Yamada | H04L 12/437 370/242 |
| 2016/0197719 A1* | 7/2016 | Wang | H04L 7/04 709/248 |
| 2017/0064606 A1 | 3/2017 | Lam et al. | |
| 2017/0288801 A1* | 10/2017 | Aweya | H04W 56/001 |
| 2019/0036631 A1* | 1/2019 | Markovic | H04W 56/0055 |
| 2020/0383076 A1 | 12/2020 | Kim et al. | |

\* cited by examiner

BYZANTINE ASYNCHRONOUS TIMING EXCHANGE FOR MULTI-DEVICE CLOCK SYNCHRONIZATION

CROSS-REFERENCE TO RELATED APPLICATIONS

This application claims priority to U.S. Provisional Application Ser. No. 62/736,579, titled "ASYNCHRONOUS TIMING EXCHANGE FOR REDUNDANT CLOCK SYNCHRONIZATION," filed on Sep. 26, 2018, U.S. Provisional Application Ser. No. 62/736,585, titled "MULTI-DEVICE ASYNCHRONOUS TIMING EXCHANGE FOR REDUNDANT CLOCK SYNCHRONIZATION," filed on Sep. 26, 2018, U.S. Provisional Application Ser. No. 62/736,589, titled "BYZANTINE ASYNCHRONOUS TIMING EXCHANGE FOR MULTI-DEVICE CLOCK SYNCHRONIZATION," filed on Sep. 26, 2018, and U.S. Provisional Application Ser. No. 62/736,592, titled "BYZANTINE FAILOVER OF CLOCK SYNCHRONIZATION," filed on Sep. 26, 2018, each of which is incorporated herein by reference in its entirety.

FEDERALLY SPONSORED RESEARCH

This invention was made with government support under Contract No. NNJ16GX07B awarded by NASA. The government has certain rights in the invention.

BACKGROUND

Various computing devices may include clocks. Computing devices' clocks control certain aspects of operation of the computing devices. For example, a clock rate of a clock may control a frequency at which components of the computing devices operate.

SUMMARY OF INVENTION

According to at least one aspect, a redundant computing system of a plurality of computing systems is provided, the redundant computer system comprising an oscillator configured to provide an oscillating signal, a counter coupled to the oscillator and configured to maintain a running total of cycles of the oscillating signal, the running total of cycles being a system clock, a communications interface configured to send and receive information to at least two other computing systems, and a processing component configured to communicate with at least two other computing systems of the plurality of computing systems, determine a first value indicative of a first time differential with respect to a first of the at least two other computing systems, communicate the first value indicative of the first time differential to the at least two other computing systems, receive a plurality of second values indicative of the first time differential, each of the second values being communicated by the at least two other computing systems, determine a third value indicated by a majority of values in a group including the first value and the plurality of second values, and store the third value.

In various examples, the processing component is further configured to store the first value in a first memory location, receive the plurality of second values, determine that the majority of values in the group including the first value and the plurality of second values are not equal to the stored first value, and overwrite the stored first value with the third value. In at least one example, the processing component is further configured to determine that the first memory location is corrupt responsive to determining that the majority of values in the group including the first value and the plurality of second values are not equal to the stored first value.

In some examples, the communications interface is further configured to receive, from each computing system of the at least two other computing systems, at least one fourth value indicative of at least one second time differential, each second time differential being determined with respect to another computing system of the plurality of computing systems. In at least one example, the processing component is further configured to store the at least one fourth value indicative of the at least one second time differential.

In at least one example, the communications interface is further configured to provide the at least one fourth value indicative of the at least one second time differential to each computing system of the plurality of computing systems. In various examples, the processing component is further configured to receive a plurality of fifth values indicative of the at least one second time differential, each of the fifth values being communicated by the at least two other computing systems, determine a sixth value indicated by a majority of values in a group including the at least one fourth value and the plurality of fifth values, determine that the majority of values in the group including the at least one fourth value and the plurality of fifth values are not equal to the stored at least one fourth value, and overwrite the stored at least one fourth value with the sixth value.

In various aspects of the disclosure, a method of operating a redundant computing system of a plurality of computing systems is provided, the method including communicating with at least two other computing systems of the plurality of computing systems, determining a first value indicative of a first time differential with respect to a first of the at least two other computing systems, communicating the first value indicative of the first time differential to the at least two other computing systems, receiving a plurality of second values indicative of the first time differential, each of the second values being communicated by the at least two other computing systems, determining a third value indicated by a majority of values in a group including the first value and the plurality of second values, and storing the third value.

In some examples, the method includes storing the first value in a first memory location, receiving the plurality of second values, determining that the majority of values in the group including the first value and the plurality of second values are not equal to the stored first value, and overwriting the stored first value with the third value. In various examples, the method includes determining that the first memory location is corrupt responsive to determining that the majority of values in the group including the first value and the plurality of second values are not equal to the stored first value.

In at least one example, the method includes receiving, from each computing system of the at least two other computing systems, at least one fourth value indicative of at least one second time differential, each second time differential being determined with respect to another computing system of the plurality of computing systems. In various examples, the method includes storing the at least one fourth value indicative of the at least one second time differential. In some examples, the method includes providing the at least one fourth value indicative of the at least one second time differential to each computing system of the plurality of computing systems.

In some examples, the method includes receiving a plurality of fifth values indicative of the at least one second time differential, each of the fifth values being communicated by the at least two other computing systems, determining a sixth value indicated by a majority of values in a group including the at least one fourth value and the plurality of fifth values, determining that the majority of values in the group including the at least one fourth value and the plurality of fifth values are not equal to the stored at least one fourth value, and overwriting the stored at least one fourth value with the sixth value.

According to aspects of the disclosure, a non-transitory computer-readable medium storing thereon sequences of computer-executable instructions for operating a computing system of a plurality of computing systems is provided, the sequences of computer-executable instructions including instructions that instruct at least one processing component to communicate with at least two other computing systems of the plurality of computing systems, determine a first value indicative of a first time differential with respect to a first of the at least two other computing systems, communicate the first value indicative of the first time differential to the at least two other computing systems, receive a plurality of second values indicative of the first time differential, each of the second values being communicated by the at least two other computing systems, determine a third value indicated by a majority of values in a group including the first value and the plurality of second values, and store the third value.

In various examples, the instructions further instruct the at least one processing component to store the first value in a first memory location, receive the plurality of second values, determine that the majority of values in the group including the first value and the plurality of second values are not equal to the stored first value, and overwrite the stored first value with the third value. In at least one example, the instructions further instruct the at least one processing component to determine that the first memory location is corrupt responsive to determining that the majority of values in the group including the first value and the plurality of second values are not equal to the stored first value.

In some examples, the instructions further instruct the at least one processing component to receive, from each computing system of the at least two other computing systems, at least one fourth value indicative of at least one second time differential, each second time differential being determined with respect to another computing system of the plurality of computing systems. In various examples, the instructions further instruct the at least one processing component to store the at least one fourth value indicative of the at least one second time differential.

In some examples, the instructions further instruct the at least one processing component to provide the at least one fourth value indicative of the at least one second time differential to each computing system of the plurality of computing systems, receive a plurality of fifth values indicative of the at least one second time differential, each of the fifth values being communicated by the at least two other computing systems, determine a sixth value indicated by a majority of values in a group including the at least one fourth value and the plurality of fifth values, determine that the majority of values in the group including the at least one fourth value and the plurality of fifth values are not equal to the stored at least one fourth value, and overwrite the stored at least one fourth value with the sixth value.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures may be represented by a like or similar numeral. For purposes of clarity, not every component may be labeled in every figure. In the figures.

DETAILED DESCRIPTION

Figure 1:
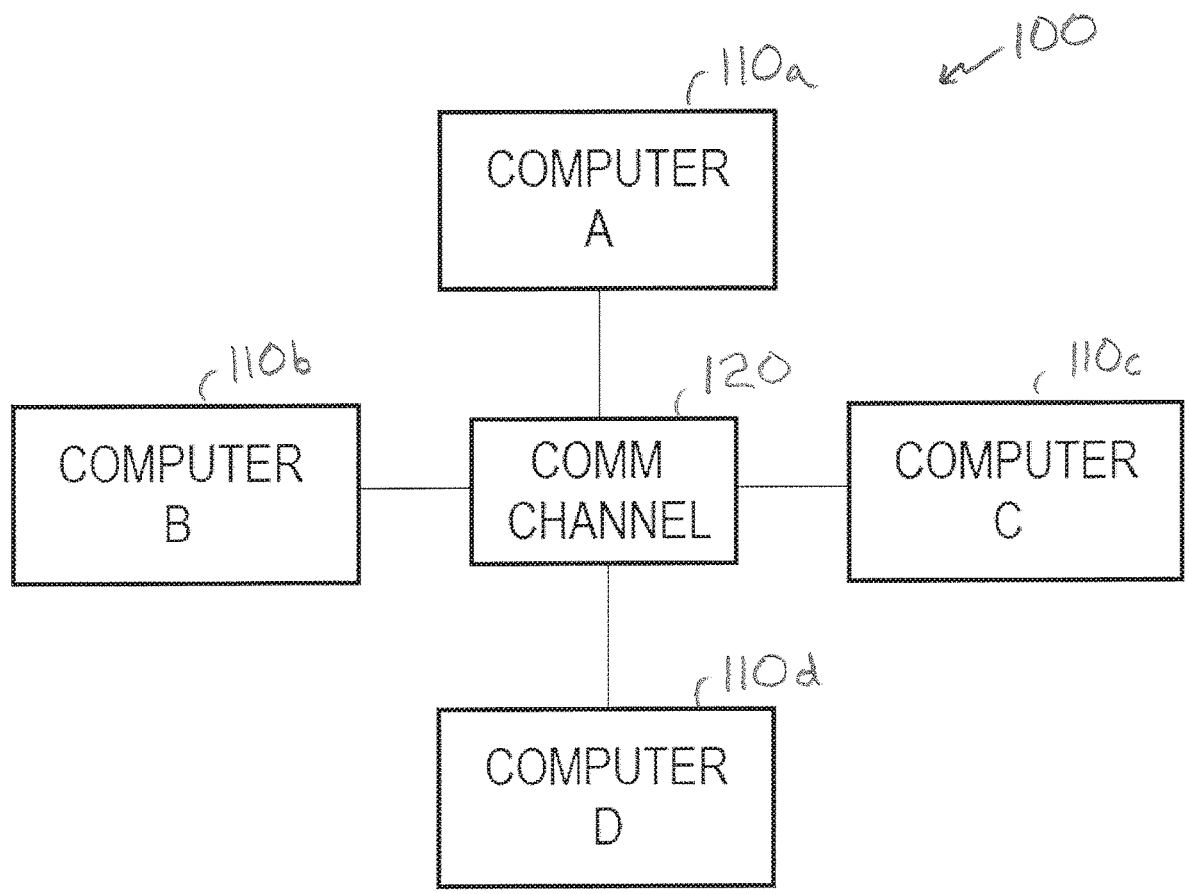
FIG. 1 is a schematic block diagram of an example fault tolerant computing system.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

With the rapid technological developments in areas such as aviation, space travel, robotics, medical devices, and electronic financial systems, there is an increasing need for computer systems to be reliable and resilient to failure. Thus, there is an ever-growing demand for reliable computing systems. Replicated computers executing redundant operations can provide fault tolerance by comparing the outputs of each of the computers and excluding any that may have generated an error during operation.

A fault-tolerant parallel processor (FTPP) architecture may provide replicated operation of processing elements, and may provide synchronization and data integrity functions. Such high-reliability systems include redundant computers such that the system may continue operation in light of a failure of one (or more) of the computers. In such systems, various computing elements may need to maintain a synchronized clock and/or provide for clock synchronization between the multiple redundant computers.

Fault-tolerant computing systems are designed to continue operating properly in the event of a failure of one or more components. Fault-tolerant systems can be robust to several possible types of failures, including but not limited to hard disk failures, input or output device failures, software bugs and errors, interface errors, operator errors, bad command sequences, single event upsets, single event latchups, and physical damage. Fault tolerant systems are useful in machines built to last a long time without any maintenance, such as space systems; computers that must be very dependable and require constant monitoring, such as monitor and control computers for nuclear power plants or supercollider experiments; and computers with high runtimes and heavy use, such as supercomputers for probability monitoring. However, the computing systems disclosed herein are not limited to these types of applications.

Referring to FIG. 1, there is illustrated a block diagram of a computing system 100 that includes four computers (or sub-systems) 110 and a communications channel 120 that allows the four computers 110 to communicate with each other. Various embodiments may include more or fewer than four computers. A system having more computers 110 may generally be capable of acceptable operation under conditions of multiple or more faults than a system of fewer computers 110. Accordingly, various embodiments of a computing system similar to the system 100 may have any number of computers and may be designed to accommodate various types or number of faults without departure from the aspects and embodiments described herein. The communications channel 120 may be of any suitable type, and may include a shared medium (for example, such that when any of the computers transmits all the computers are capable of receiving) or may include dedicated media (for example, individual point-to-point communications channels between each pair of the computers, such as a mesh network).

In various embodiments, each of the computers 110 includes a synchronization component that maintains a synchronized clock with the other of the computers 110. Accordingly, each of the computers 110 (when properly functioning) may include a synchronized clock that matches a similar synchronized clock in all of the other computers 110, within some tolerance or variance criterion. Various embodiments of systems and methods described herein provide a capability to maintain the synchronized clocks in a synchronized status.

Each of the computers 110 may include an internal or system clock, which may not be synchronized with the internal or system clocks of the other computers 110. Each of the system clocks may be driven or provided by an oscillator, for example, a local oscillator (LO), that provides an oscillating signal of a certain degree of stability, for example, accuracy, precision, to a counter that maintains a running total of the number of cycles of the oscillating signal, to within a maximum count at which time the counter may "rollover" to start again at zero. Accordingly, a counter driven by an oscillator may be a system clock that maintains a reference time (for example, in number of oscillator cycles). For example, in at least one embodiment, a local oscillator may be included to provide an oscillating signal (or clock signal) at a nominal frequency of 35 MHz, with an accuracy of +/−50 ppm, and a counter having 48 bits of resolution may count the clock cycles of the oscillating signal. Accordingly, such a 48-bit counter driven by a 35 MHz oscillator increments by 35,000,000 every second and rolls over (for example, to start again at zero) approximately every 3 months (91.31 days). The value provided by the counter at any given time is the system clock.

To maintain a synchronized clock, each of the computers 110, or the synchronization component of each of the computers 110, may maintain an offset value that when added to the respective system clock provides the synchronized clock. In various embodiments, two separate oscillators, respectively of two of the computers 110, may be well-matched in that their frequencies have only a slight variance, and thus an offset value for the system clock of one of the computers to be "adjusted" to provide a synchronized clock (for example, synchronized with the other of the computers) may be substantially constant. By contrast, a slowly changing offset value (for example, slowly increasing or decreasing over time) suggests that one of the oscillators runs faster than the other. An offset value that changes over time, but within an accepted rate of change (for example, implying that the oscillators of two computers 110 are not running at exactly the same frequency), is accommodated by the systems and methods described herein.

In various embodiments, however, a rapidly changing offset value and/or an offset value that changes drastically from one moment to the next and/or changes at highly varying rates over time may indicate that the system clock (for example, the oscillator, counter, or other component) of at least one of the computers 110 is malfunctioning. Accordingly, systems and methods described herein may reject or ignore the clocking information from such a malfunctioning one of the computers 110. For example, at various times, all the computers 110 may maintain a synchronized clock that is synchronized to a system clock of a particular one of the computers 110, which is thereby the leader. In other words, each of the computers 110 may maintain a synchronized clock that is synchronized to a leader, and the leader may be a particular one of the computers 110. Accordingly, if the system clock of the leader is detected to be malfunctioning (for example, by errant behavior of the offset value described above), a new one of the computers 110 may be selected to be a new leader, and the various computers 110 may begin synchronizing with the new leader.

Figure 2:
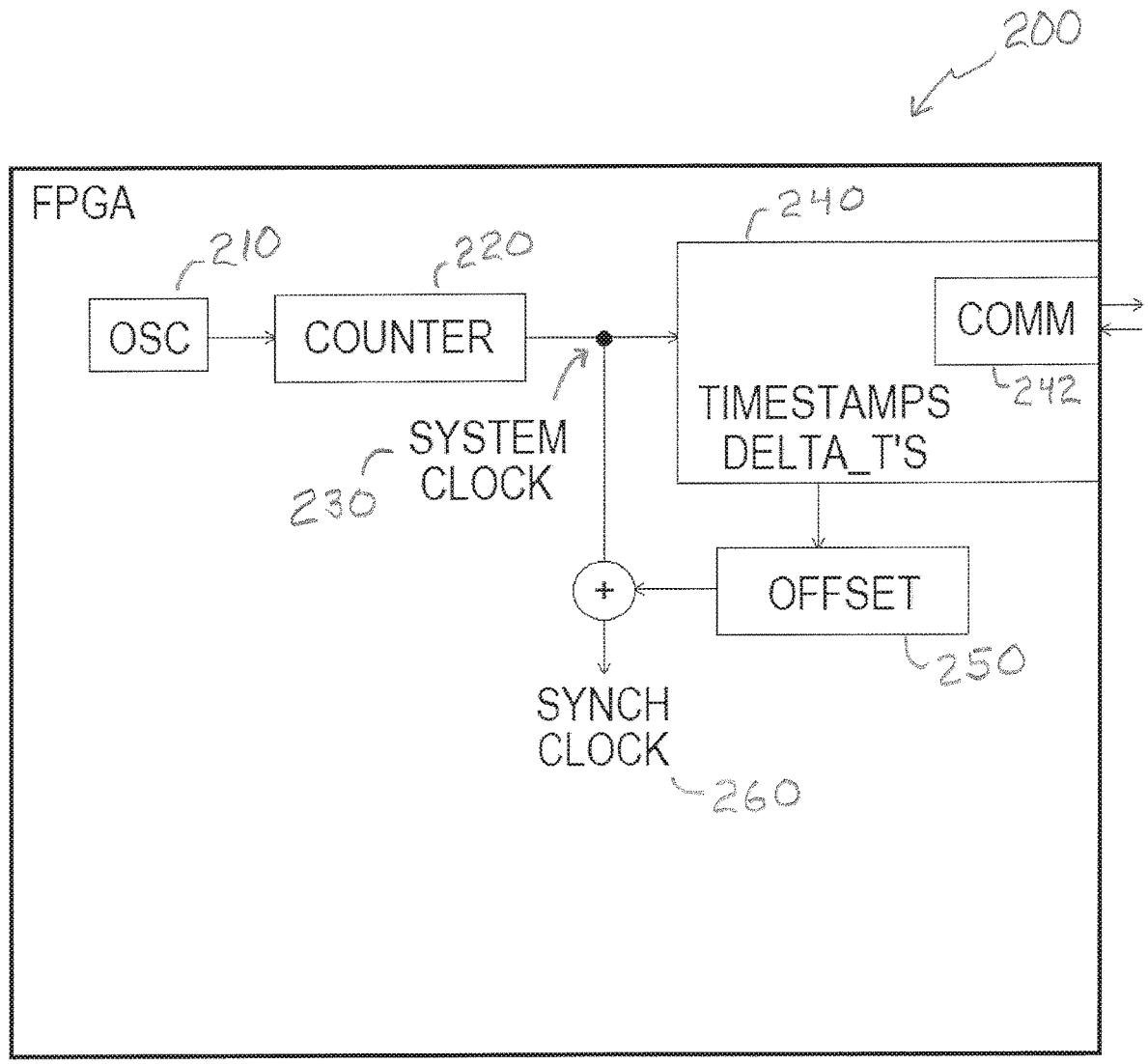
FIG. 2 is a schematic block diagram of an example component of a computer of a fault tolerant computing system.

FIG. 2 illustrates a block diagram of a component 200 that may be responsible for maintaining a synchronized clock in certain embodiments. In some embodiments, the component 200 may be implemented in a hardware form, such as an application-specific integrated circuit (ASIC) or as a field-programmable gate array (FPGA). For example, such hardware embodiments, or the like, may exhibit consistent processing times that contribute to accuracy of the synchronized clock. Other embodiments, however, may include varying degrees of hardware implementation and may include software or firmware instructions to be processed by a more generic processing component.

In various embodiments, the component 200 may include an oscillator 210 that drives a counter 220 to provide a system clock 230 (as described above). A timing sub-component 240 may maintain communications with others of the computers 110 (for example, via a communication interface 242 that couples to the communications channel 120) to determine an offset 250 that when added to the system clock 230 yields a synchronized clock 260. The offset 250 may, at various times, be a positive or negative value, for example, based upon whether the system clock 230 is behind or ahead of the leader's clock, respectively. The timing sub-component 240 communicates with the leader (for example, another one of the computers 110) to determine the proper value of the offset 250 that will cause the system clock 230 to "synchronize" with the leader's clock when modified by the offset 250, for example, by adding the offset 250 to the system clock 230, to provide the synchronized clock 260. In various examples, if the component 200 is a part of the computer 110 that is the leader, the offset may be zero, for example, because the system clock 230 of the leader is the synchronized clock 260. Accordingly, the leader's system clock 230 does not need to be modified.

Operation of the timing sub-component 240 is described to illustrate, in at least one embodiment, how a value is determined for the offset 250. At an example time, the computer 110a may be the leader to which the other computers 110 are to synchronize their clocks. Accordingly, each of the other computers 110b, 110c, 110d carries out communications that allow determination (as described in greater detail below) of a respective offset 250 having a value that, when added to their respective system clock 230, provides a synchronized clock 260 that is synchronized with the system clock 230 of the leader computer 110a. Accordingly, the synchronized clock 260 maintained at each respective computer 110 will be synchronized with each of the synchronized clocks 260 at the other of the computers 110.

In at least one embodiment, each of the computers 110 includes a component 200 responsible for maintaining the synchronized clock 260. As for timing information communicated over the communications channel 120, such may be variously described herein as being an equivalent communication by any of the computer 110, the synchronization component 200 of the respective computer 110, or the timing sub-component 240 of the respective component 200. Accordingly, timing data and/or information communicated by and between any of the computers 110 may be communicated by and between respective components 200 and sub-components 240 of the computers 110, for example, via respective communication interfaces 242 and conveyed by the communications channel 120. For ease of illustration herein, the communications channel 120 is exemplified herein as providing conveyance from each of the computers 110 to every other of the computers 110 at once (for example, such as a shared media), but dedicated channels between individual pairs of the computers 110 are capable of providing similar conveyance of transmitted data, as will be understood by one of skill in the art.

Returning to an example in time of the computer 110a being a leader to which the other computers 110 will synchronize, an illustrative description of the operation of the computer 110b to synchronize with the computer 110a is presented. Accordingly, the computer 110b (for example, via a respective component 200) operates to provide a synchronized clock 260 which matches, within some variance or tolerance criterion, with the system clock 230 of the leader computer 110a.

Figure 3:
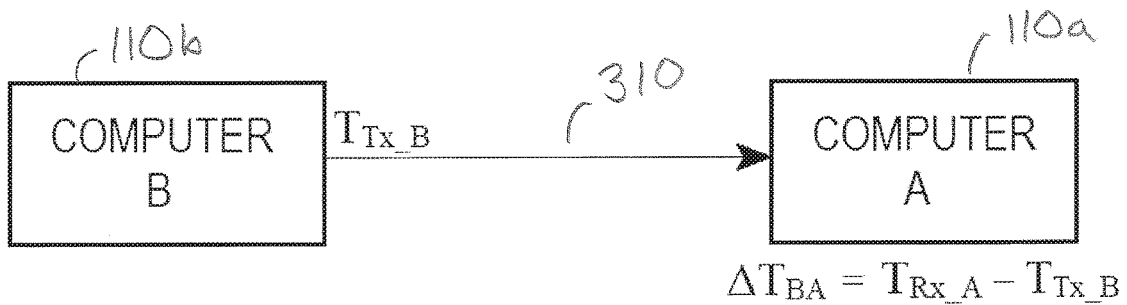
FIG. 3 is a schematic diagram of an example communications exchange of timing information between two example computers of a fault tolerant computing system.
Figure 3:
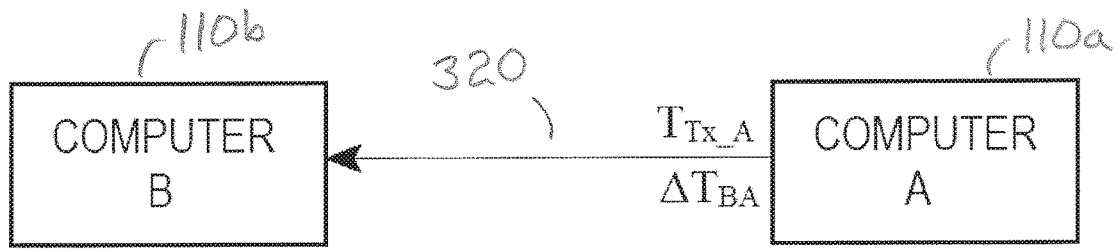

As illustrated by FIG. 3, the computer 110b transmits a communication 310 (for example, via a packet, frame, datagram, etc.) which includes the time of the transmission, $T_{Tx\_B}$, based upon the system clock 230 of the computer 110b. The leader computer 110a receives the transmission and determines a time differential ($\Delta T_{BA}$) value based on the receive time, $T_{Rx\_A}$, according to the leader's system clock 230. Accordingly, the time difference $\Delta T_{BA}=T_{Rx\_A}-T_{Tx\_B}$ represents the time difference as determined by computer A based on the received time (according to A's system clock 230) relative to the transmitted time (according to B's system clock 230). Further, the time difference $\Delta T_{BA}$ includes various processing and transmission times for the transmission from B to A and includes the offset of A's clock relative to B's clock (for example, if A's clock is ahead of B's clock, the amount by which A's clock is ahead is included in the $\Delta T_{BA}$ value determined by computer A; if A's clock is behind B's clock, the offset is still included but may be a negative value). Accordingly, while $\Delta T_{BA}$ may calculated by computer 110a as a difference between a pair of transmit and receive times, the value may be equivalently expressed as $\Delta T_{BA}=TT_{BA}+O_{BA}$, where $TT_{BA}$ is the transit time (including processing at each of the computers) for the information to transit from B to A, and $O_{BA}$ is the offset value of A's system clock 230 relative to B's system clock 230 (for example, positive if A is ahead of B, negative if A is behind B).

Further illustrated in FIG. 3, the computer 110a transmits a communication 320 that is received by the computer 110b. The communication 320 includes the time of the transmission, $T_{Tx\_A}$, based upon the system clock 230 of the computer 110a, and includes the time difference $\Delta T_{BA}$ that was determined by the computer 110a. Accordingly, the computer 110b may determine a new time difference, $\Delta T_{AB}=T_{Rx\_B}-T_{Tx\_A}$, that represents the time difference as determined by computer B based on the received time (according to B's system clock 230) relative to the transmitted time (according to A's system clock 230). Similar to the above time difference (from B to A) determined by the computer 110a, the new time difference (for example, from A to B) is determined by the computer 110b. Similar to the above, the new time difference may also be expressed as a transit time and an offset, $\Delta T_{AB}=TT_{AB}+O_{AB}$.

In various embodiments, the computers 110 are of identical or nearly identical nature. Accordingly, it may be presumed and/or may be enforced by design that processing and transmission of timing information from A to B may take approximately the same amount of time as processing and transmission of timing information from B to A, for example, $TT_{BA} \approx TT_{AB}$. Further, the offset of A's system clock relative to B's is the same as B's relative to A's, with opposite sign, for example, $O_{AB}=-O_{BA}$. Accordingly, subtracting the new time difference in one direction (for example, calculated by the computer 110b) from the earlier time difference in the opposite direction (for example, calculated by the computer 110a), may yield an approximate offset 250 to within a certain allowed variance criterion, as illustrated by Eq. (1).

$$\Delta T_{BA}-\Delta T_{AB}=(TT_{BA}+O_{BA})-(TT_{AB}+O_{AB})\approx 2O_{BA} \qquad (1)$$

Accordingly, after the exchange of the communications 310, 320, the computer 110b may calculate an offset 250 that may be added to the system clock 230 of the computer 110b to provide a synchronized clock 260 that is synchronized with the leader computer 110a. Similarly, each of the other computers 110 may carry out a similar exchange of communications with the computer 110a such that all the computers 110 are provided with a synchronized clock 260 which is synchronized with the leader computer 110a.

Further, each of the computers 110 may at intervals conduct further exchange of communications, for example, similar to those illustrated in FIG. 3, such that each of the computers 110 may continuously update an appropriate offset 250 to the leader computer 110a to maintain their respective synchronized clock 260. For example, the offset 250 may drift due to the leader's system clock 230 being faster or slower than the system clock 230 of any respective other one of the computers 110. Accordingly, the value of an offset 250 indicates a difference in system clocks at a particular time, and a changing value of the offset 250 over time indicates a difference in clock rates (for example, oscillator frequency) between the leader computer 110a and a respective one of the other computers 110.

As described above, each of the computers 110 may maintain a respective synchronized clock 260 that is synchronized with a leader or master clock, such as the system clock 230 of the leader computer 110a. Each of the computers 110 exchanges messages with the leader (for example, computer 110a) and maintains $\Delta T$ values from itself to the leader and from the leader to itself, from which the respective computer 110 may calculate or determine an appropriate offset 250, as described above. Each respective computer 110 then maintains synchronization with the leader by adjusting a respective system clock 230 by the determined offset 250, as further described above. In some embodiments, timing information may be communicated, and $\Delta T$ values may be calculated and/or stored by a sub-component 240, as illustrated in FIG. 2, which may include processing capability for calculations and memory for storage of $\Delta T$ values and/or offset values. Various embodiments may communicate, calculate, determine, and store such information in differing ways.

According to various embodiments, a system similar to system 100 in FIG. 1 may establish a leader from among the computers 110 and may exchange timing information (as described above) to synchronize with the leader's clock. In further embodiments, the computers may maintain additional timing information to provide capability for a rapid recovery or failover to another one of the computers as a new leader, such as in case of failure of the leader computer.

Figure 4:
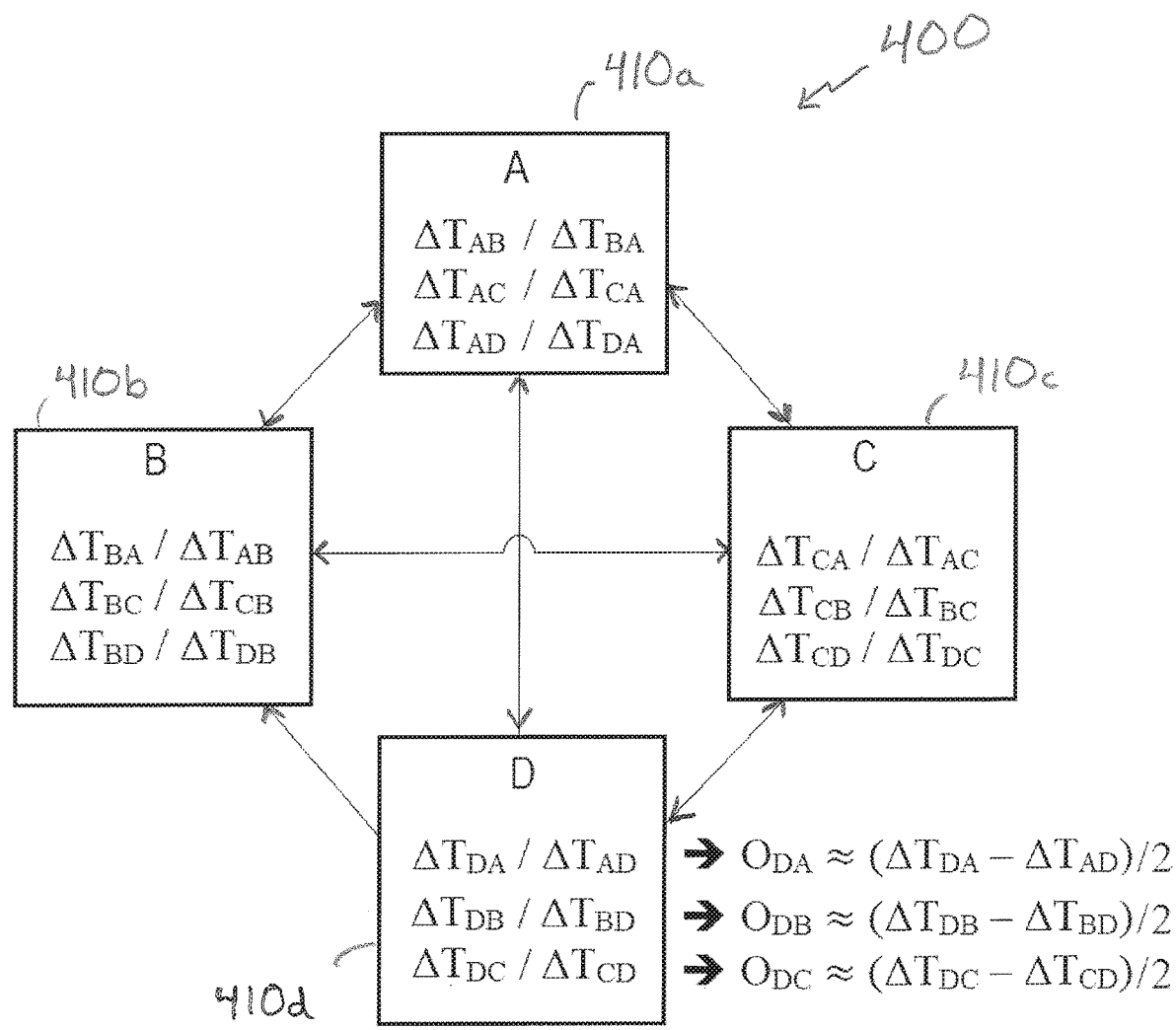
FIG. 4 is a schematic block diagram of another example fault tolerant computing system.

Illustrated in FIG. 4 is a block diagram of a system 400 that includes a number of computers 410 (as shown, four computers 410, but may include more or fewer computers in various embodiments), each of which maintains $\Delta T$ values relative to a number of the other computers 410 and not just relative to a leader. Accordingly, any of the computers 410 may "convert" or change their synchronized clock to be synchronized to any of the other computers at any moment, in a rapid time, and in as short as one clock cycle in some embodiments. Rapid failover to another leader clock is made possible because $\Delta T$ values and, optionally, offset values, to a plurality of the other computers 410 are maintained by the computers 410. For example, each of the computers 410 may determine $\Delta T$ values to each of the other computers 410 at regular intervals and store the $\Delta T$ values in a memory, such that the stored $\Delta T$ values are immediately available to calculate an offset value to synchronize with a different leader clock. In some embodiments, any of the computers 410 may at regular intervals calculate offset values to multiple of the other computers 410 (or other potential leader clocks), for example, from the stored $\Delta T$ values, and may store the calculated offset values such that the offset values are immediately available to synchronize with a different leader clock. Accordingly, the system 400 may quickly establish a new leader (for example, a selected one of the computers 410, or another clock source in various embodiments) and all be synchronized to the new leader with minimal delay.

For example, and with continued reference to FIG. 4, each of the computers 410 may maintain a table of $\Delta T$ values, the $\Delta T$ values being as described above and representative of one-way measured time differences that include transit time and offsets between the system clocks 230 of the respective computers 410. Accordingly, for the example of FIG. 4 with four computers 410, each of the computers 410 may maintain or store a table of six $\Delta T$ values, for example, a pair of $\Delta T$ values for each of the other (three) computers 410 to which it may need to synchronize. For example, the computer 410d maintains a first pair of $\Delta T$ values representing two-way time differentials between the computer 410d and the computer 410a, a second pair of $\Delta T$ values representing two-way time differentials between the computer 410d and the computer 410b, and a third pair of $\Delta T$ values representing two-way time differentials between the computer 410d and the computer 410c. Accordingly, the computer 410d may rapidly determine an offset to synchronize with any of the system clocks 230 of the computers 410a, 410b, 410c, and in some embodiments may maintain a table of such offset values, for example, by calculating the offset values at routine intervals based upon the $\Delta T$ values. Accordingly, rapid synchronization to any system clock is made possible by routine communication of timing information (for example, communications 310, 320 of FIG. 3) to multiple potential leaders to maintain a table of $\Delta T$ values and/or offset values. Accordingly, the system 400 may rapidly recover from a failure of a leader clock by re-synchronizing with a system clock of a new leader. In various embodiments, a new leader or a "next leader" may be previously identified, configured, and/or agreed upon among the computers 410, for example.

Each of the computers 410 may calculate a $\Delta T$ value, based upon the receive time of its own system clock 230, when it receives a message from any other of the computers 410. The message includes a transmit time based upon the other's system clock 230. Accordingly, in the example system 400 having four computers 410, each of the computers 410 may determine three $\Delta T$ values (on an on-going basis), one for each of the other three computers 410 with which the respective computer 410 exchanges timing information. In various embodiments, each of the computers 410 may maintain the latest calculated $\Delta T$ value based upon only the latest received message from which the $\Delta T$ value is calculated. In other embodiments, one or more of the computers 410 may maintain a history or log of previous $\Delta T$ values, for example, reaching back an amount of time, which may be configurable.

In accord with the above, each of the computers 410 calculates $\Delta T$ values in one direction, for example, as the receive side of a time difference communication. Each of the computers 410 "learns" of the relevant $\Delta T$ values for the reverse direction (for example, a time difference as the transmit side) by the respective other computer 410 communicating its calculated $\Delta T$ value(s). For example, with reference to the computer 410c, the computer 410c calculates a receive time difference, $\Delta T_{AC}$, with respect to the computer 410a (for example, the time difference for a communication from computer A to computer C). Whereas the computer 410c learns of a transmit time difference, $\Delta T_{CA}$, with respect to the computer 410a, by virtue of the computer 410a communicating to the computer 410c a time difference calculated by the computer 410a. Likewise, the computer 410c notifies (communicates) the time difference, $\Delta T_{AC}$, that was calculated by the computer 410c to the computer 410a.

Further, as described above, with the benefit of the various $\Delta T$ values, each of the computers 410 may always be ready to synchronize with any of the other system clocks 230 associated with the other computers 410. Additionally, in some embodiments, each of the computers 410 may determine or maintain offset values to each of the other computers 410, for example, based upon the $\Delta T$ values.

Further in accord with the above, while each of the computers 410 is shown in FIG. 4 as maintaining six $\Delta T$ values (for example, for an example system of four computers 410), it should be noted that there are a total of twelve $\Delta T$ values illustrated because each of the six $\Delta T$ values maintained at any one of the computers 410 is also maintained at another one of the computers 410. For example, the $\Delta T$ value, $\Delta T_{AC}$, is maintained in memory at each of the computer 410a and the computer 410c.

Figure 5:
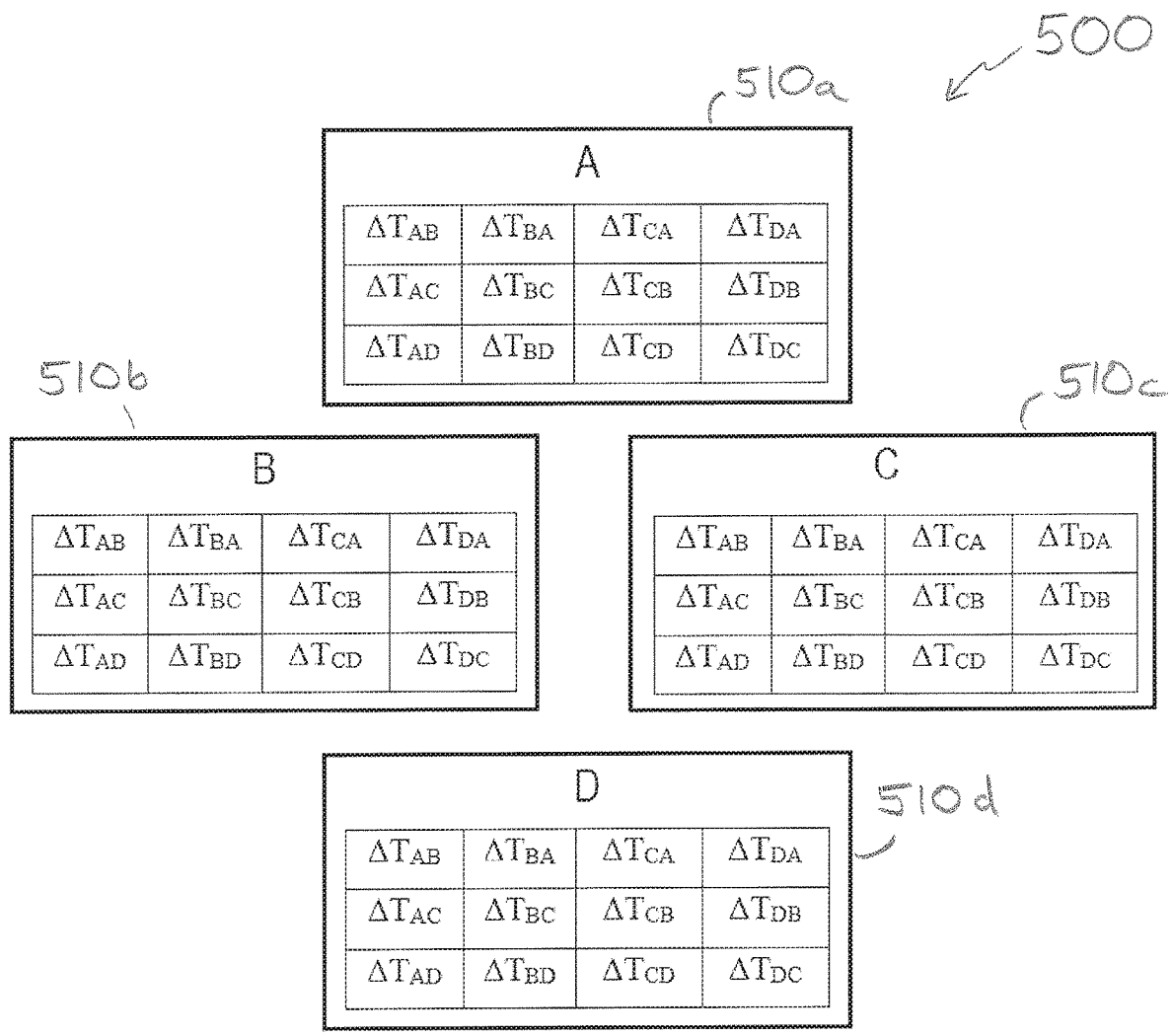
FIG. 5 is a schematic block diagram of another example fault tolerant computing system.

In some embodiments, each of the computers 410 may maintain a complete table of all the $\Delta T$ values in the system. Accordingly, with reference to FIG. 5, for an example system 500 having four computers 510, a complete table of $\Delta T$ values may include:

TABLE 1

| $\Delta T_{AB}$ | $\Delta T_{BA}$ | $\Delta T_{CA}$ | $\Delta T_{DA}$ |
| $\Delta T_{AC}$ | $\Delta T_{BC}$ | $\Delta T_{CB}$ | $\Delta T_{DB}$ |
| $\Delta T_{AD}$ | $\Delta T_{BD}$ | $\Delta T_{CD}$ | $\Delta T_{DC}$ |

Accordingly, a complete set of $\Delta T$ values for a system in accord with aspects and embodiments described herein may include $N\times(N-1)$ values, where N is the number of computers in the system. In some embodiments, if one or more of the computers 510 experiences a failure, the remaining ones of the computers 510 may cease maintaining $\Delta T$ values with respect to the failed computer(s) 510. Accordingly, a complete table of $\Delta T$ values may at times be less than $N\times(N-1)$.

Figure 6:
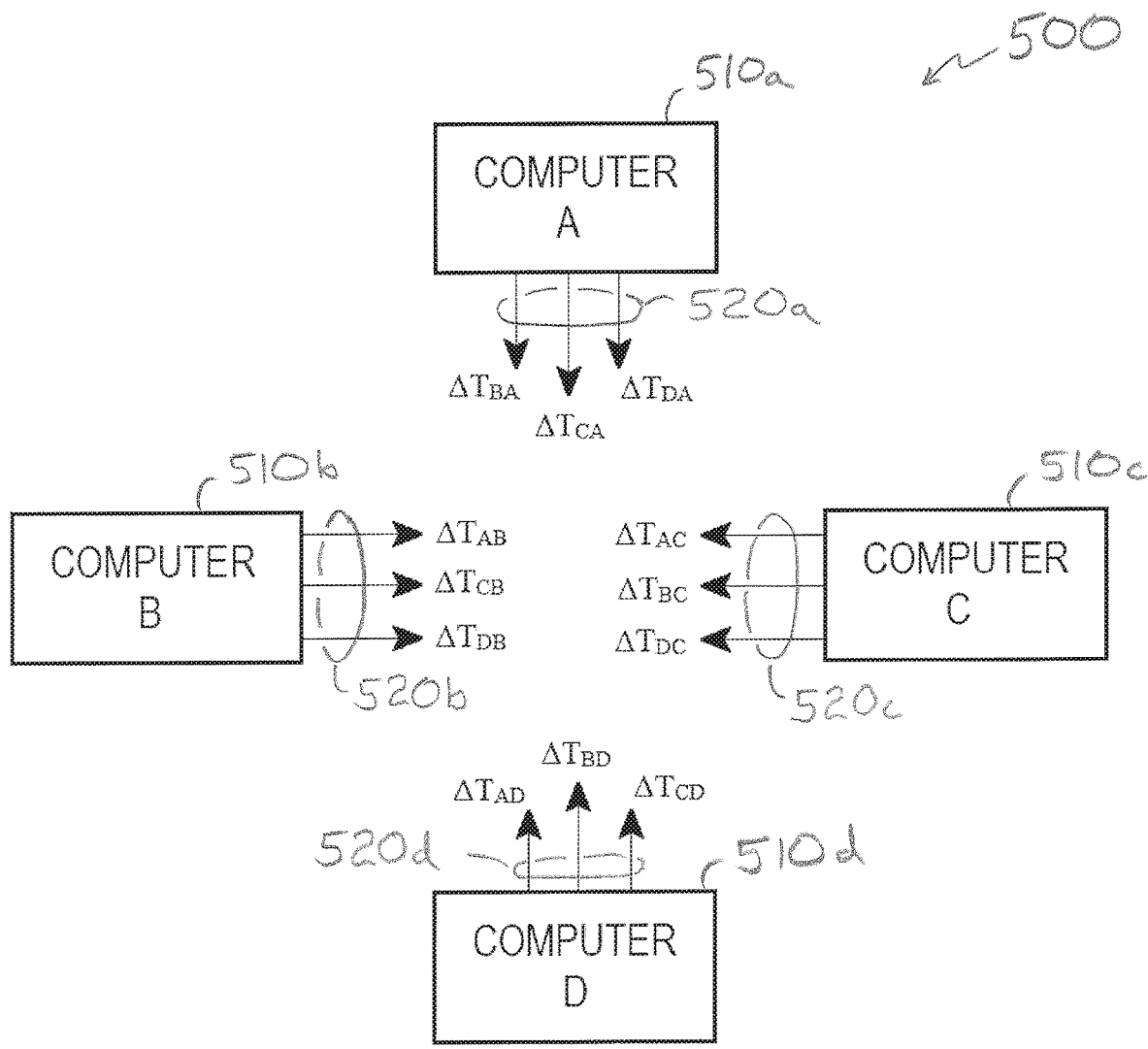
FIG. 6 is a schematic diagram of another example communications exchange of timing information between computers of a fault tolerant computing system.

Referring to FIG. 6, each of the computers 510 of the example system 500 may populate its respective table of $\Delta T$ values by communicating timing information by various messages 520, for example, via the communications channel 120. For example, at various intervals, each of the computers 510 may communicate each of the various $\Delta T$ values that the respective computer calculated. As above, each respective computer 510 may calculate a $\Delta T$ value when it receives various communications, for example, such as the communications 310, 320 of FIG. 3. Such communications may be dedicated for the purpose of determining and sharing timing information in various embodiments, but in some embodiments any communication may include a transmit time from which a $\Delta T$ value may be calculated, and communications for other purposes may include one or more fields for the communication of $\Delta T$ values. Accordingly, each of the computers 510 may calculate $\Delta T$ values based upon any received communication and/or may communicate its calculated $\Delta T$ values by including them in any other communication, according to various embodiments.

In some embodiments, the communications channel 120 may be a shared medium such that each message 520 sent by a computer 510 is receivable by each of the other computers 510. Accordingly, each of the computers 510 receives, over time, a complete set of $\Delta T$ values. In other embodiments, the communications channel 120 may be comprised of point-to-point communication links and each computer 510 may send messages 520 individually to the others of the computers 510 such that each of the computers 510 receives, over time, a complete set of $\Delta T$ values. In various embodiments, one or more of the messages 520 may be broadcast and/or multi-cast directed messages, such that each of the computers 510 receives, over time, a complete set of $\Delta T$ values.

At least one benefit of maintaining a complete set of $\Delta T$ values, by each of the computers 510, is that each of the computers 510 is capable of calculating an offset value between any two of the computers 510 in the computing system 500, which further enables each of the computers 510 to monitor a condition of the system clock 230 of each of the computers 510. Accordingly, for example, the computers 510 may select the most stable of the system clocks 230 to be the leader clock at any given time, and may set their respective offset value 250 to provide a synchronized clock 260 in synchronization with the leader clock.

With respect to offsets between various system clocks and stability of one or more system clocks, an offset value that remains constant implies that two system clocks are running at the same rate, for example, neither is faster than the other. An offset value that increases or decreases at a constant rate implies that one system clock is faster or slower than the other, respectively. An offset value that increases or decreases at a significant (though constant) rate may imply that one of the system clocks is out-of-specification, for example, running much faster or slower than its rated tolerance, and is failing to accurately keep time. An offset value that varies rapidly and/or erratically (for example, not at a constant increase or decrease) implies that at least one of the system clocks is not running at a constant rate and may be seriously out-of-specification, is failing, and/or has been compromised, for example, by environmental risks such as ionizing radiation. For example, a clock failure may be caused by a failure in either of the oscillator 210 or the counter 220, or in other components, such as by irradiation of a logic component, memory, register, and so forth.

In conventional systems, a single offset value maintained for synchronization to a leader clock may indicate a failure (for example, by increasing or decreasing rapidly or erratically, such as by increasing at a rate that exceeds a threshold value) yet is incapable of indicating which clock is the source of the problem. For example, with respect to FIG. 1, if the computer 110b is synchronized to the computer 110a and an offset value indicates a clock error or failure, it is impossible for the computer 110b to determine whether its own system clock is out-of-specification or whether the leader clock (the computer 110a) is out-of-specification. With the advantage of aspects and embodiments described herein, however, various offset values to others of the computers and between others of the computers may indicate which clock is out-of-specification. For example, if the offsets for the computer 510d relative to all the others of the computers 510 are erratic, such implies that the system clock 230 of the computer 510d is failing. Accordingly, the computer 510d should not act as the leader clock, and if the computer 510d is the active leader clock, the system 500 may synchronize to a new leader.

A further advantage to maintaining a table of additional $\Delta T$ values (for example, between others of the computers 510) is that any respective one of the computers 510 may determine an offset to any of the others of the computers 510 even if communications to the other of the computers 510 is lost. For instance, the computer 510a may be a current leader clock, but in the instance that the computer 510c loses communication with the computer 510a, the computer 510c is capable of determining an offset to synchronize with the computer 510a via the table of ΔT values with respect to one or more of the other computers 510. For example, the computer 510c maintains ΔT values of itself relative to the computer 510b and also maintains ΔT values of the computer 510b to the computer 510a (the leader). Accordingly, the computer 510c may determine an appropriate offset to synchronize with the computer 510b and an appropriate offset for the computer 510b to synchronize with the computer 510a (the leader), and the sum of such offsets is an appropriate offset value for the computer 510c to synchronize with the computer 510a, even though direct communications to the computer 510a is lost.

Each of the computers 510 may determine an offset to synchronize with a leader clock via the table of ΔT values with respect to any number of the other computers 510. For example, while in the foregoing example the computer 510c determines an appropriate offset to synchronize with the computer 510a via a single intermediate computer (that is, the computer 510b), the computer 510c may determine an appropriate offset to synchronize with the computer 510a via any number of intermediate computers.

For example, the computer 510c may determine an appropriate offset to synchronize with the computer 510b, an appropriate offset for the computer 510b to synchronize with the computer 510d, and an appropriate offset for the computer 510d to synchronize with the computer 510a (the leader). A sum of such offsets is an appropriate offset value for the computer 510c to synchronize with the computer 510a via two intermediate computers, even though direct communications to the computer 510a is lost.

In various embodiments, each of the computers 510 may communicate ΔT values calculated by others of the computers 510. In other words, each of the computers may communicate the entire table of current ΔT values it maintains, rather than only the ΔT values it calculated. For example, and with reference to FIG. 7, there is shown an example system 700 that is similar to the example systems 400, 500. The computers 710 of the system 700 communicate (for example, via the communications channel 120) with each other and include transmit times in their various communications such that each of the computers 710 may calculate ΔT values based upon messages (for example, packets) a respective computer receives, communicate the ΔT values that the respective computer calculated, and maintain a table of all the latest ΔT values in the system, all as described above. According to the system 700, each of the computers 710 also communicates ΔT values calculated by others of the computers 710 (for example, not just its own ΔT values).

Figure 7:
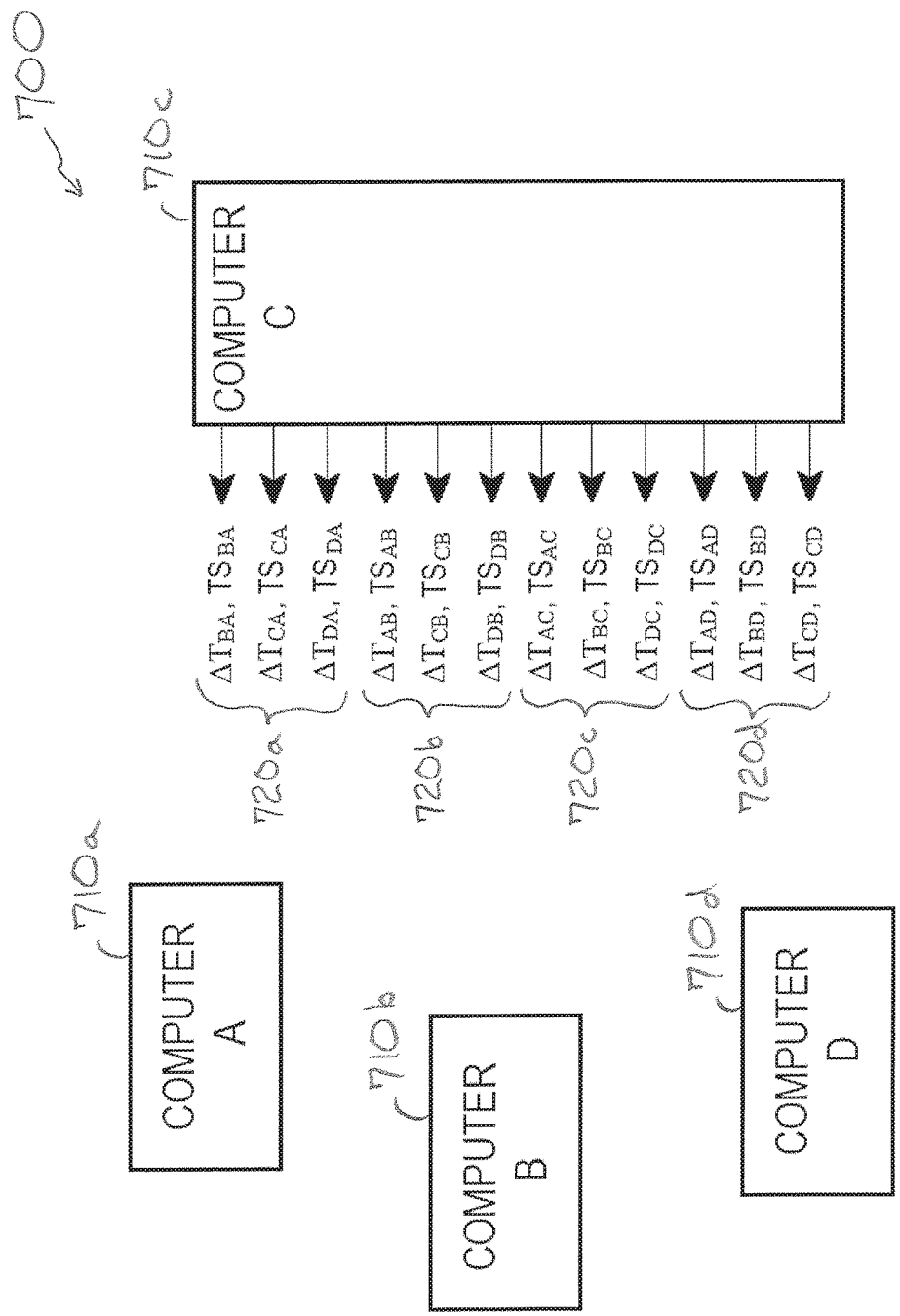
FIG. 7 is a schematic diagram of another example communications exchange of timing information between computers of a fault tolerant computing system.

Accordingly, with reference to the computer 710c in FIG. 7, which is representative of the behavior of each of the computers 710, the computer 710c communicates messages 720c that include ΔT values calculated by the computer 710c and also communicates messages 720a, 720b, 720d that include ΔT values calculated by each of the computers 710a, 710b, 710d, respectively. Each communication of a ΔT value may include a timestamp, $TS_x$, that refers to the time that the ΔT value was calculated (for example, with respect to the system clock 230 of the respective computer 710 that calculated the ΔT value). For example, a time difference ΔT value from the computer 710d to the computer 710a, $\Delta T_{DA}$, is calculated by the receiving computer 710a at time $T_{Rx\_A}$, and accordingly is given a timestamp $TS_{DA} = T_{Rx\_A}$. A later-calculated ΔT value from the computer 710d to the computer 710a will have a later value timestamp, $TS_{DA}$.

With continued reference to FIG. 7, each of the computers 710 communicates ΔT values that a respective computer calculated as well as other ΔT values the respective computer has collected to populate and maintain a table of ΔT values for the system 700. A ΔT value included in a message from the respective one of the computers 710 that calculated the ΔT value may be referred to herein as a source ΔT value, and the message may be referred to herein as a source message or a source exchange, for example, because the ΔT value is being communicated by the "source" of the ΔT value, for example, by the respective computer 710 that calculated the ΔT value. Conversely, a ΔT value included in a message from one of the computers 710 that was calculated by another of the computers 710 may be referred to herein as a reflected ΔT value, for example, because the ΔT value is being re-communicated or "reflected" back to the other computers 710 of the system 700. In some examples, a reflected ΔT value may refer to a ΔT value sent back to the respective computer 710 that calculated it. In other examples, any ΔT value being sent by one of the computers 710 that did not calculate the ΔT value may be termed a reflected ΔT value.

Accordingly, the messages 720a, 720b, 720d as illustrated in FIG. 7 include reflected ΔT values (and may be referred to as reflected messages) because they are being sent by the computer 710c but they were not calculated by the computer 710c. Instead, the ΔT values included in the messages 720a, 720b, 720d were calculated by the computers 710a, 710b, 710d, respectively, and were previously communicated by source messages from the computers 710a, 710b, 710d, respectively, to the computer 710c.

Accordingly, in some embodiments, the messages 720c as illustrated in FIG. 7 may be single-source messages because they include ΔT values calculated by the computer 710c that is sending them.

Each of the computers 710 may behave in similar manner to each of the other computers 710. Accordingly, each of the computers 710 may communicate their single-source ΔT values, receive other single-source ΔT values from others of the computers 710, communicate the other single-source ΔT values received from the others of the computers 710 (for example, as reflected ΔT values), and receive reflected ΔT values from each of the others of the computers 710. Accordingly, each of the computers 710 may receive multiple copies (or reports) of any particular ΔT value. Each of the computers 710 may further keep track of the most recent value of any particular ΔT value by comparing the timestamp associated with each ΔT value.

In some embodiments, each of the computers 710 may maintain a table of ΔT values across the system 700, or as complete a set as possible, for example, under failure or other interrupted conditions, based upon a voting scheme, which may in some examples be a majority rule voting scheme. For example, with respect to any of the computers 710, any particular ΔT value (and its corresponding timestamp) may be in memory, may be communicated out to the others of the computers 710, and may be received from each of the others of the computers 710. For instance, in the example system 700 that includes four computers 710, each of the computers 710 at any given time may have four copies of any particular ΔT value (and its corresponding timestamp) including, for example, one active value in its table of ΔT values and three values from the other three of the computers 710. Accordingly, any time a majority of these four values match each other (for example, by their ΔT value and their timestamp, TS), the majority value may be "accepted" as the correct value and copied into the active value of its table of ΔT values.

At least one advantage of a voted exchange, as briefly described above, to accept a "winning" or majority value for inclusion in (to populate) a table of values (for example, ΔT values in this example), is that if one or more of the computers 710 has a faulty memory location it will provide an erroneous value (for example, for one of the ΔT values and/or the timestamps) but the voted exchange acts to discard the erroneous value because it does not match the value(s) from the others of the computers 710. In some embodiments, each of the computers 710 may further be configured to overwrite its own calculated ΔT value(s) in the instance that its own (stored) calculated ΔT value does not match a majority of what the other computers 710 report that the respective ΔT value(s) is.

For example, a respective one of the computers 710 may communicate a self-calculated source ΔT value. A memory location in which the ΔT value is stored may become corrupted, which might cause an erroneous offset and an out-of-synchronization condition. However, when the others of the computers 710 "reflect" the respective computer's 710 ΔT value back to the respective computer, the majority rule may override the stored ΔT value to re-populate the stored ΔT value with the correct value. In some embodiments, the computer 710 may, upon a recurring override of a value stored in a memory location, be configured to determine that the memory location is faulty (that is, bad and/or corrupt). For example, if values stored in a certain memory location are corrected (for example, re-populated) a threshold number of times by the voting scheme, such may indicate the memory location is bad and the computer 710 may disable the memory location and use another memory location instead.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A redundant computing system of a plurality of computing systems, the redundant computing system comprising:
   an oscillator configured to provide an oscillating signal;
   a counter coupled to the oscillator and configured to maintain a running total of cycles of the oscillating signal, the running total of cycles being a system clock;
   a communications interface configured to send and receive information to at least two other computing systems of the plurality of computing systems; and
   a processing component configured to:
      communicate with the at least two other computing systems;
      determine a first value indicative of a first time differential with respect to a first of the at least two other computing systems;
      communicate the first value indicative of the first time differential to the at least two other computing systems;
      receive a plurality of second values indicative of the first time differential, each of the second values being communicated by the at least two other computing systems;
      determine a third value indicated by a majority of values in a group including the first value and the plurality of second values; and
      store the third value, wherein the processing component is further configured to store the first value in a first memory location,
         determine that the majority of values in the group including the first value and the plurality of second values is not equal to the stored first value, and
         replace the stored first value with the third value.

2. The redundant computing system of claim 1, wherein the processing component is further configured to determine that the first memory location is corrupt responsive to determining that the majority of values in the group including the first value and the plurality of second values is not equal to the stored first value.

3. The redundant computing system of claim 1, wherein the communications interface is further configured to receive, from each computing system of the at least two other computing systems, at least one fourth value indicative of at least one second time differential, each second time differential being determined with respect to another computing system of the plurality of computing systems.

4. The redundant computing system of claim 3, wherein the processing component is further configured to store the at least one fourth value indicative of the at least one second time differential.

5. The redundant computing system of claim 4, wherein the communications interface is further configured to provide the at least one fourth value indicative of the at least one second time differential to each computing system of the plurality of computing systems.

6. The redundant computing system of claim 5, wherein the processing component is further configured to:
   receive a plurality of fifth values indicative of the at least one second time differential, each of the fifth values being communicated by the at least two other computing systems;
   determine a sixth value indicated by a majority of values in a group including the at least one fourth value and the plurality of fifth values;
   determine that the majority of values in the group including the at least one fourth value and the plurality of fifth values are not equal to the stored at least one fourth value; and
   overwrite the stored at least one fourth value with the sixth value.

7. A method of operating a redundant computing system of a plurality of computing systems, the method comprising:
   communicating with at least two other computing systems of the plurality of computing systems;
   determining a first value indicative of a first time differential with respect to a first of the at least two other computing systems;
   communicating the first value indicative of the first time differential to the at least two other computing systems;
   receiving a plurality of second values indicative of the first time differential, each of the second values being communicated by the at least two other computing systems;
   determining a third value indicated by a majority of values in a group including the first value and the plurality of second values; and storing the third value, the method further comprising:
  storing the first value in a first memory location;
  determining that the majority of values in the group including the first value and the plurality of second values is not equal to the stored first value; and
  replacing the stored first value with the third value.

8. The method of claim 7, further comprising determining that the first memory location is corrupt responsive to determining that the majority of values in the group including the first value and the plurality of second values is not equal to the stored first value.

9. The method of claim 7, further comprising receiving, from each computing system of the at least two other computing systems, at least one fourth value indicative of at least one second time differential, each second time differential being determined with respect to another computing system of the plurality of computing systems.

10. The method of claim 9, further comprising storing the at least one fourth value indicative of the at least one second time differential.

11. The method of claim 10, further comprising providing the at least one fourth value indicative of the at least one second time differential to each computing system of the plurality of computing systems.

12. The method of claim 11, further comprising:
  receiving a plurality of fifth values indicative of the at least one second time differential, each of the fifth values being communicated by the at least two other computing systems;
  determining a sixth value indicated by a majority of values in a group including the at least one fourth value and the plurality of fifth values;
  determining that the majority of values in the group including the at least one fourth value and the plurality of fifth values are not equal to the stored at least one fourth value; and
  overwriting the stored at least one fourth value with the sixth value.

13. A non-transitory computer-readable medium storing thereon sequences of computer-executable instructions for operating a computing system of a plurality of computing systems, the sequences of computer-executable instructions including instructions that instruct at least one processing component to:
  communicate with at least two other computing systems of the plurality of computing systems;
  determine a first value indicative of a first time differential with respect to a first of the at least two other computing systems;
  communicate the first value indicative of the first time differential to the at least two other computing systems;
  receive a plurality of second values indicative of the first time differential, each of the second values being communicated by the at least two other computing systems;
  determine a third value indicated by a majority of values in a group including the first value and the plurality of second values; and
  store the third value, wherein the instructions further instruct the at least one processing component to
    store the first value in a first memory location,
    determine that the majority of values in the group including the first value and the plurality of second values is not equal to the stored first value, and
    replace the stored first value with the third value.

14. The non-transitory computer-readable medium of claim 13, wherein the instructions further instruct the at least one processing component to determine that the first memory location is corrupt responsive to determining that the majority of values in the group including the first value and the plurality of second values is not equal to the stored first value.

15. The non-transitory computer-readable medium of claim 13, wherein the instructions further instruct the at least one processing component to receive, from each computing system of the at least two other computing systems, at least one fourth value indicative of at least one second time differential, each second time differential being determined with respect to another computing system of the plurality of computing systems.

16. The non-transitory computer-readable medium of claim 15, wherein the instructions further instruct the at least one processing component to store the at least one fourth value indicative of the at least one second time differential.

17. The non-transitory computer-readable medium of claim 16, wherein the instructions further instruct the at least one processing component to:
  provide the at least one fourth value indicative of the at least one second time differential to each computing system of the plurality of computing systems;
  receive a plurality of fifth values indicative of the at least one second time differential, each of the fifth values being communicated by the at least two other computing systems;
  determine a sixth value indicated by a majority of values in a group including the at least one fourth value and the plurality of fifth values;
  determine that the majority of values in the group including the at least one fourth value and the plurality of fifth values are not equal to the stored at least one fourth value; and
  overwrite the stored at least one fourth value with the sixth value.

* * * * *